United States Patent
Ichikawa et al.

(10) Patent No.: US 8,703,585 B2
(45) Date of Patent: Apr. 22, 2014

(54) ADHESIVE COMPOSITIONS FOR A SEMICONDUCTOR, AN ADHESIVE SHEET FOR A SEMICONDUCTOR AND A PRODUCTION METHOD OF A SEMICONDUCTOR DEVICE

(75) Inventors: Isao Ichikawa, Tokyo (JP); Masaaki Furudate, Tokyo (JP); Mikihiro Kashio, Chiba (JP); Sou Miyata, Chiba (JP); Kaisuke Yanagimoto, Saitama (JP); Yuichi Kozone, Saitama (JP)

(73) Assignee: LINTEC Corporation, Tokyo (JP)

( * ) Notice: Subject to any disclaimer, the term of this patent is extended or adjusted under 35 U.S.C. 154(b) by 140 days.

(21) Appl. No.: 13/359,553

(22) Filed: Jan. 27, 2012

(65) Prior Publication Data
US 2012/0196404 A1    Aug. 2, 2012

(30) Foreign Application Priority Data
Jan. 28, 2011  (JP) ................................. 2011-016899

(51) Int. Cl.
*H01L 21/50* (2006.01)
(52) U.S. Cl.
USPC ................. 438/464; 257/E21.516; 428/317.1
(58) Field of Classification Search
CPC ... H01L 21/6836; C08G 59/38; C09J 7/0225; C09J 7/026
USPC ................... 438/464; 257/E21.516; 523/400; 428/317.1
See application file for complete search history.

(56) References Cited

U.S. PATENT DOCUMENTS

| | | | | |
|---|---|---|---|---|
| 4,948,366 | A * | 8/1990 | Horn et al. | 433/9 |
| 5,138,014 | A * | 8/1992 | Katano et al. | 528/29 |
| 6,277,481 | B1 * | 8/2001 | Sugino et al. | 428/317.1 |
| 2002/0016411 | A1 * | 2/2002 | Ando et al. | 525/100 |
| 2002/0161121 | A1 * | 10/2002 | Yoshioka et al. | 525/166 |
| 2007/0276066 | A1 * | 11/2007 | Ohno et al. | 524/186 |
| 2010/0133703 | A1 * | 6/2010 | Karasawa et al. | 257/777 |
| 2013/0084051 | A1 * | 4/2013 | Namazue et al. | 385/143 |
| 2013/0116378 | A1 * | 5/2013 | Wakabayashi et al. | 524/588 |

FOREIGN PATENT DOCUMENTS

| | | |
|---|---|---|
| JP | 10008001 A | 1/1998 |
| JP | 2000017246 A1 | 1/2000 |

OTHER PUBLICATIONS

English abstract of JP2000017246 A1 (Jan. 18, 2000).
English abstract of JP10008001 A (Jan. 13, 1998).
English abstract of JP08-239636 (Sep. 17, 1996).
English abstract of JP02-032181 (Feb. 1, 1990).

* cited by examiner

*Primary Examiner* — Caridad Everhart
(74) *Attorney, Agent, or Firm* — Cahn & Samuels, LLP

(57) ABSTRACT

An adhesive composition for a semiconductor includes an acrylic polymer (A), an epoxy-based heat curable resin (B), a heat curing agent (C), a silane compound (D) having an organic functional group, molecular weight of 300 or more and an alkoxy equivalent of larger than 13 mmol/g, and a silane compound (E) having an organic functional group, molecular weight of 300 or less and an alkoxy equivalent of 13 mmol/g or less.

5 Claims, No Drawings

ADHESIVE COMPOSITIONS FOR A SEMICONDUCTOR, AN ADHESIVE SHEET FOR A SEMICONDUCTOR AND A PRODUCTION METHOD OF A SEMICONDUCTOR DEVICE

This U.S. application claims priority of Japanese patent document 2011-016899 filed on Jan. 28, 2011, the entirety of which is incorporated herein by reference.

FIELD OF THE INVENTION

The present invention relates to a adhesive composition suitable for the use in the step of die bonding a semiconductor element (semiconductor chip) to an organic substrate or a die pad portion of a lead flame or to another semiconductor chip, and the step of die bonding a semiconductor chip to an adhered portion wherein the semiconductor chip is made by dicing the semiconductor wafer; a semiconductor adhesive sheet comprising the adhesive layer formed from said adhesive composition, and a production method of a semiconductor device using thereof.

DESCRIPTION OF THE RELATED ART

A semiconductor wafer such as silicon and gallium arsenide or so are produced in the status of larger diameter. The semiconductor wafer is transferred to the bonding step which is the following step after it is cut and separated (dicing) into small pieces. At this time, while the semiconductor wafer is adhered on the adhesive sheet, the steps of dicing, washing, drying, expanding and picking up are carried out, then it is transferred to the bonding step which is the next step.

Among these steps, in order to simplify the process of the pick up step and the bonding step, various adhesive sheets for dicing and die bonding which comprise the wafer fixing function and the die adhesive function are proposed (for example, Patent document 1 to 4). The adhesive sheet disclosed in the patent documents 1 to 4 enables so called direct die bonding, and allows to omit the pasting step of a adhesive agent for a die bonding. For example, by using said adhesive sheet, the direct die bonding between the organic substrate-chip, lead flame-chip, chip-chip or so becomes possible.

By the way, recently, the required physical property against the semiconductor device has become extremely strict. For example, high package reliability under high temperature and humidity condition is required. Also, when connecting the electronic component, the surface mounting method (reflow) is carried out in which the entire package is exposed to higher temperature than the solder melting point. Recently, due to the transition to the solder which does not include lead, the mounting temperature has increased to 260° C. or so. Thus, the stress generated inside the semiconductor package has become larger than before, and the chances of causing problems such as the releasing at the adhering interface and the package cracks or so has increased.

Usually, in order to solve these problems, the adhesiveness is improved by using the silane coupling agent, however, because of its low activity. sufficient adhesiveness couldn't be exhibited when using the silane coupling agent of monomer type having small molecular weight. Therefore, in the patent document 4, the adhesiveness is improved by using the silane coupling agent of oligomer type.

Also, usually, the adhesive sheet is used after being stored for a certain period of time, thus the storage stability at the temperature above the normal temperature is important. In the patent document 4, the silane coupling agent of oligomer type having high reactivity is used, and it discloses that the adhesive sheet of the patent document 4 has high storage stability. However, the evaluation method of the storage stability in the patent document 4 is a method which measures the adhesiveness (the releasing strength) of the adhesive sheet right after the adhesive sheet is carried out an acceleration treatment at 50° C. for 5 days and the cured. That is, this method does not take into the consideration of the environmental changes such as heat and humidity of after mounting when used as the adhesive agent for the semiconductor device. Also, the evaluation method is carried out by adhering the two metal board by using the adhesive sheet, then after curing the adhesive agent, the metal board is peeled off. However, the evaluated main characteristic of the adhesive agent after curing is the cohesion property. When using the silane coupling agent of oligomer type, due to its high reactivity, during the storage of the adhesive sheet, the reaction between the alcoxy groups against each other or the alcoxy group and the inorganic filler material surface may proceed. Even when the reaction between the alcoxy groups against each other, or the alcoxy group and the inorganic filler material surface proceeds during the storage, there are only small influence to the cohesion property after the curing. However, the adhesiveness of the interface between the adhesive sheet and the adherend portion tends to decline since enough alcoxy group those which should react with the adherend portion is not left when curing. As a result, when the adhesive sheet is adhered and cured after storing for certain period of time then exposed to the high temperature and humidity condition than usual, the adhesive force thereof cannot be maintained, the decline of the package reliability and the die adhesive function becomes bigger problem.

PRIOR ART DOCUMENT

Patent Document

[Patent Document 1] Japanese Patent Application Laid Open H02-032181
[Patent Document 2] Japanese Patent Application Laid Open H08-239636
[Patent Document 3] Japanese Patent Application Laid Open H10-008001
[Patent Document 4] Japanese Patent Application Laid Open 2000-017246

SUMMARY OF THE INVENTION

The object of the present invention is to provide an adhesive composition for a semiconductor superior in the package reliability and the adhesiveness when going through the hot and humid harsh condition and the reflow steps, a semiconductor adhesive sheet comprising the adhesive layer comprising said adhesive composition, and the production method of the semiconductor device using thereof.

The present inventors have carried out keen examination to solve the above objects. As a result, they have found that by using the silane coupling agent of oligomer type having high reactivity together with the silane coupling agent of monomer type having low reactivity, the above objects can be solved; thereby the present invention was attained.

That is, the subject of the present invention is as follows.
(1) An adhesive composition for a semiconductor comprising an acrylic polymer (A), an epoxy-based heat curable resin (B), a heat curing agent (C), a silane compound (D) having an organic functional group, molecular weight of 300 or more and an alcoxy equivalent of larger than 13 mmol/g, and a silane compound (E) having an organic functional group, molecular weight of 300 or less and an alcoxy equivalent of 13 mmol/g or less.

(2) The adhesive composition for a semiconductor as set forth in (1), wherein the organic functional group in said silane compound (D) or said silane compound (E) is epoxy group.

(3) A semiconductor adhesive sheet comprising a base sheet and an adhesive layer of the adhesive composition for a semiconductor as set forth in (1) or (2) on the base sheet.

(4) A production method of a semiconductor device comprising steps of adhering the semiconductor wafer to an adhesive layer of semiconductor adhesive sheet as set forth in (3) and dicing the semiconductor wafer to form a semiconductor chip, picking up the semiconductor chip from the base sheet with transferring the adhesive layer to the back side of the chip, then thermocompression bonding the semiconductor chip to a die pad via said adhesive layer.

According to the present invention, an adhesive composition for a semiconductor superior in the package reliability and the adhesiveness when going through the hot and humid harsh condition and the reflow steps, a semiconductor adhesive sheet comprising the adhesive layer made from said adhesive composition, and the production method of the semiconductor device using thereof can be provided.

DESCRIPTION OF THE PREFERRED EMBODIMENT

Hereinafter, the adhesive composition for a semiconductor, the semiconductor adhesive sheet and the production method of the semiconductor device of the present invention will be described. Note that, hereinafter, the adhesive composition for a semiconductor of the present invention may be simply referred as "adhesive composition", and the semiconductor adhesive sheet of the present invention may be simply referred as "adhesive sheet", and the adhesive layer formed by the adhesive composition for a semiconductor of the present invention may be simply referred as "adhesive layer".
(The Adhesive Composition for a Semiconductor)

The adhesive composition for a semiconductor of the present invention comprises an acrylic polymer (A), epoxy-based heat curable resin (B), a silane compound (D) having an organic functional group, molecular weight of 300 or more, and an alcoxy equivalent of larger than 13 mmol/g, and a silane compound (E) having an organic functional group, molecular weight of 300 or less, and an alcoxy equivalent of 13 mmol/g or less. Also, in order to improve the various physical properties of the adhesive compositions, other component may be blended depending on the needs. Hereinafter, each of these components is described specifically.
Acrylic Polymer (A)

As for the acrylic polymer (A), conventionally known acrylic polymer can be used. The weight average molecular weight (Mw) of the acrylic polymer (A) is preferably 10,000 to 2,000,000, and more preferably 100,000 to 1,500,000. If the Mw of the acrylic polymer (A) is too low, the adhesive force between the adhesive layer and a base sheet becomes high which may cause pick up malfunction of the chip. If the Mw of the acrylic polymer (A) is too high, the adhesive layer may not be able to follow the ridges and grooves of the adherend, and may become the cause of the void or so. The Mw of the acrylic polymer (A) is a polystyrene corresponding value measured by the gel/permeation chromatography (GPC) method.

The glass transition temperature (Tg) of the acrylic polymer (A) is preferably −60 to 70° C., and more preferably −30 to 50° C. If the Tg of the acrylic polymer (A) is too low, the releasing force between the adhesive layer and the base sheet becomes large and may cause the pick up malfunction of the chip. If the Tg of the acrylic polymer (A) is too high, the adhesive force for fixing the wafer may become insufficient.

As the monomer constituting the acrylic polymer (A), for example, (meth)acrylate and the derivatives thereof may be mentioned. Specifically, alkyl(meth)acrylate having 1 to 18 carbon atoms of alkyl group such as methyl(meth)acrylate, ethyl(meth)acrylate, propyl(meth)acrylate, butyl(meth)acrylate or so; (meth)acrylate having cyclic back bone such as cycloalkyl(meth)acrylate, benzyl(meth)acrylate, isobornyl (meth)acrylate, dicyclopentanyl(meth)acrylate, dicyclopentenyl(meth)acrylate, dicyclopentenyloxyethyl(meth)acrylate, imide(meth)acrylate or so; (meth)acrylate containing hydroxyl group such as hydroxymethyl(meth)acrylate, 2-hydroxyethyl(meth)acrylate, 2-hydroxypropyl(meth)acrylate or so; glycidyl acrylate and glycidyl methacrylate or so may be mentioned. Also, acrylic acid, methacrylic acid, itaconic acid or so may be used as well. These may be used alone or by combining two or more.

Among these, as the monomer constituting the acrylic polymer (A), it is preferable to at least use the (meth)acrylate containing the hydroxyl group since the acrylic polymer having good compatibility with the epoxy-based heat curable resin (B) can be obtained. In this case, in the acrylic polymer (A), the constituting unit derived from the (meth)acrylate containing the hydroxyl group is preferably included within the range of 1 to 20 wt %, and more preferably within the range of 3 to 15 wt %. As the acrylic polymer (A), specifically, the copolymer of alkyl(meth)acrylate and (meth)arylate containing hydroxyl group is preferable.

Also, together with above (meth)acrylate and the derivative thereof, vinyl acetate, acrylonitrile, styrene or so may be used as the material of the acrylic polymer (A) within the range that does not compromise the object of the present invention.
Epoxy-Based Heat Curable Resin (B)

As the epoxy-based heat curable resin (B), various epoxy resin of the conventionally known type can be used. As for the epoxy resin, epoxy resin having 2 or more of functional groups in the structural unit such as bisphenol A type epoxy resin, bisphenol F type epoxy resin, phenylene back bone type epoxy resin, phenol novolak type epoxy resin, cresol novolak type epoxy resin, dicyclopentadiene type epoxy resin, biphenyl type epoxy resin, triphenolmethane type epoxy resin, heterocyclic type epoxy resin, stilbene type epoxy resin, condensed aromatic hydrocarbon modified epoxy resin, or halide thereof may be mentioned. These epoxy resins may be used alone, or by combining two or more.

The epoxy equivalent of the epoxy resin is not particularly limited, however it is preferably 150 to 1000 (g/eq). Note that, the epoxy equivalent is a value measured according to the JIS K7236:2008.

In the adhesive composition of the present invention, the content of the epoxy-based heat curable resin (B) is usually 1 to 1500 parts by weight, preferably 3 to 1000 parts by weight with respect to 100 parts by weight of the acrylic polymer (A). If the content of the epoxy-based heat curable resin (B) becomes less than said range, the adhesive layer having sufficient adhesive force may not be able to obtain. Also, if the content of the epoxy-based heat curable resin (B) exceeds said range, the film forming ability is lost and the adhesive layer cannot formed into sheet form hence the production becomes difficult.
Heat Curing Agent (C)

The heat curing agent (C) functions as the heat curing agent against the epoxy-based heat curable resin (B). As for the heat curing agent (C), a compound having 2 or more functional group which reacts with the epoxy group within the molecule may be mentioned, and as for the functional group, phenolic hydroxyl group, alcoholic hydroxyl group, amino group, carboxyl group, acid anhydride group or so may be mentioned. Among these, phenolic hydroxyl group, amino group, acid anhydride group are preferable, and the phenolic hydroxyl group and amino group are more preferable.

As the specific example of heat curing agent (C), phenolic heat curing agent such as novolak type phenol resin, dicyclopentadiene type phenol resin, triphenol methane type phenol resin, aralkyl phenol resin or so; the amine type heat curing agent such as DICY (dicyandiamide) or so may be mentioned. The heat curing agent (C) may be used alone or by mixing two or more.

In the adhesive composition of the present invention, the content of the heat curing agent (C) is usually 0.1 to 500 parts by weight, and preferably 1 to 200 parts by weight with respect to 100 parts by weight of epoxy-based heat curable resin (B). If the content of the heat curing agent (C) becomes below said range, the curability of the adhesive composition becomes insufficient and the adhesive layer having sufficient adhesive force may not be obtained. If the content of the heat curing agent (C) exceeds said range, the moisture absorption rate of the adhesive composition increases and the reliability of the semiconductor package may decline.

Silane Compound (D) Having an Organic Functional Group, Molecular Weight of 300 or More, and an Alcoxy Equivalent of Larger than 13 mmol/g As for the organic functional group of the silane compound (D) having an organic functional group, molecular weight of 300 or more, and an alcoxy equivalent of larger than 13 mmol/g (hereinafter it may be simply referred as "silane compound (D)"), those which reacts with the functional group of the acrylic polymer (A) or the epoxy-based heat curable resin (B) is preferable, such as epoxy group, (meth)acryloyl group, vinyl group those which are not the vinyl group included in (meth)acryloyl group, mercapto group or so may be mentioned. Among these, epoxy group is preferable. Note that, alcoxy equivalent indicates the absolute number of the alcoxy group included in per unit weight of the compound, and it is the same in the present invention.

The silane compound (D) as the high molecular weight compound easily undergoes the hydrolysis reaction. Therefore, when heat curing the adhesive composition, the silane compound (D) carries out the chemical reaction efficiently and easily with the adherend surface, thus it easily binds with the adherend surface, also tends to have a dipole interaction with the adherend surface. Thus, even when it is used without the storage time after made into the adhesive layer, the adhesion interface between the adhesive layer and the adherend surface can be strong, thus even if the adhesive layer is exposed to a hot and highly humid condition, the water intrusion to the adhesion interface between the adhesive layer and the adherend can be prevented, thus the effect to maintain the adhered condition is high even when it is stimulated by the heat at later stage (hereinafter, it may be referred as "post heat moist adhesion maintaining effect").

As for the silane compound (D), specifically, oligomer type compounds of condensed product formed by hydrolysis and dehydration condensation of the alcoxy group of the low molecular silane compound having 2 or 3 alcoxy group such as γ-glycidoxypropyltrimethoxysilane, γ-glycidoxypropyltriethoxysilnae, γ-glycidoxypropyltrimethyldiethoxysilnae, γ-(methacrylopropyl)trimethoxysilnae or so; and the low molecular silane compounds having 4 alcoxy group such as tetramethoxysilnae, tetraethoxysilane or so, may be mentioned. Particularly, among the above low molecular silane compounds, the oligomer of the condensed compound formed by the dehydration condensation of the low molecular silane compound having 2 or 3 alcoxy group and the low molecular silane compound having 4 alcoxy group has good reactivity of the alcoxy group and has sufficient number of the organic functional group thus it is preferable, for example, oligomer of the copolymer of poly3-(2,3-epoxypropoxy)propylmethoxysiloxane and polydimethoxysiloxane may be mentioned.

In the adhesive composition of the present invention, the content of the silane compound (D) is usually 0.01 to 7.0 wt %, and preferably 0.1 to 2.0 wt %, within the entire adhesive composition (in terms of the solid portion). Also, the content of the silane compound (D) is preferably 0.01 to 10 parts by weight, and more preferably 0.1 to 3 parts by weight, with respect to 100 parts by weight of total of the component (A) to (E) (in terms of solid portion). If the content of the silane compound (D) becomes below said range, during the heat curing of the adhesive composition, the silane compound (D) may become difficult to react with the adherend surface chemically or to have the dipole interaction with the adherend surface, thus as a result, sufficient adhesiveness may not be exhibited. If the content of the silane compound (D) exceeds said range, the surface tension of the adhesive composition is increased, and when forming into a sheet, it becomes the cause of the repelling which may make the production difficult. Also, the adhesive layer cannot be released from the base sheet while it remains on the back face of the chip, thus the process may become difficult. That is, the malfunction in the production and in the process may be caused.

The adhesive composition for a semiconductor of the present invention may comprise the silane compound (D') which is not the silane compound (D), and having a molecular weight of 300 or more and an alcoxy equivalent of larger than 13 mmol/g (hereinafter, it may be referred as "silane compound (D')"). The silane compound (D'), since it does not comprise the organic functional group, it does not react with the functional group which the acrylic polymer (A) and the epoxy-based heat curable resin (B) possesses, however it does have the alcoxy group hence it reacts with the alcoxy group of other molecule or the adherend surface, or it may react with the surface of the inorganic filler (J), which is blended depending on the case, and associate with the curing of the adhesive composition. As for the silane compound (D'), polymethoxysiloxane, polyethoxy siloxane, and the copolymer of the polymethoxysiloxane and the polydimethylsiloxane or so may be mentioned.

Silane Compound (E) Having an Organic Functional Group, and Molecular Weight of 300 or Less and Alcoxy Equivalent of 13 mmol/g or Less As the organic functional group of the silane compound (E) having an organic functional group, and molecular weight of 300 or less and alcoxy equivalent of 13 mmol/g or less (hereinafter it may be simply referred as "silane compound (E)"), those which reacts with the functional group of acrylic polymer (A) and epoxy-based heat curable resin (B) or so are preferable, and as such organic functional group, epoxy group, (meth)acryloyl group, vinyl group excluding the vinyl group in the (meth)acryloyl group, mercapto group or so may be mentioned. Among these, epoxy group is preferable.

The silane compound (E) has molecular weight of 300 or less and alcoxy equivalent of 13 mmol/g or less, hence it has low reactivity and unlikely to undergo the hydrolysis reaction, thus the alcoxy group is likely to be remained even after the storage for a certain period of time. Also, after made into the adhesive layer and left in a storage period for certain time, the alcoxy group of the silane compound (E), though it has poor reactivity, part of it will undergo a condensation reaction between the molecules and becomes multimer. Thus, as similar to the silane compound (D), the silane compound (E) becomes easier to bind with the adherend surface, and also it becomes to have a tendency to have dipole interaction with the adherend surface, during the heat curing of the adhesive composition carried out after being stored for a certain period. Thereby, the adhesion of the interface between the adhesive layer and the adherend surface can be made strong, hence the post heat moist adhesion maintaining effect is high even after being stored for certain period of time.

As for the silane compound (E), γ-glycidoxypropyltrimethoxysilane, γ-glycidoxypropyltriethoxysilane, γ-glycidoxypropylmethyldiethoxysilane, β-(3,4-epoxycyclohexyl)ethyltrimethoxysilane, γ-(methacrylopropyl)trimethoxysilane, N-phenyl-γ-aminopropyltrimethoxysilane, γ-ureidepropyltriethoxysilane, N-6-(aminoethyl)-γ-aminopropylmethyldiethoxysilane, γ-mercaptopropyltriethoxysilane, γ-mercaptopropylmethyldimethoxysilane, vinyltriacetoxysilane or so may be mentioned.

In the adhesive composition of the present invention, the content of the silane compound (E) is usually 0.01 to 7.0 wt %, and preferably 0.1 to 2.0 wt %, within the entire adhesive composition (in terms of the solid portion). Also, the content of the silane compound (E) is preferably 0.01 to 10 parts by weight, and more preferably 0.1 to 3 parts by weight, with respect to 100 parts by weight of total of components (A) to (E) (in terms of the solid portion). If the content of the silane compound (E) becomes below said range, sufficient adhesiveness may not be exhibited during the heat curing of the adhesive composition after being stored at above room temperature for certain period of time. If the content of the silane compound (E) exceed said range, the surface tension of the adhesive composition is increased, and when forming into a sheet, it may become the cause of the repelling which may make the production difficult. Also, the adhesive layer cannot be released from the base sheet while transferring on the back face of the chip, thus the process may become difficult. That is, the malfunction in the production and the process may be caused.

The adhesive composition for a semiconductor of the present invention may comprise, other than the silane compound (E), a silane compound (E') having molecular weight of 300 or less and alcoxy equivalent 13 mmol/g or less (hereinafter, it may simply referred as "silane compound (E')). The silane compound (E'), since it does not comprise the organic functional group, it does not react with the functional group which the acrylic polymer (A) and the epoxy-based heat curable resin (B) have, however it does have the alcoxy group hence it reacts with the alcoxy group of other molecule or the adherend surface, or in some case it may react with the surface of the inorganic filler (J) and associate with the curing of the adhesive composition. As for the silane compound (E'), for example, phenylethoxysilane, decyltriethoxysilane or so can be used.

The Effect Obtained by Using the Silane Compound (D) and the Silane Compound (E) Together On one hand, the silane compound (D) has the high post heat moist adhesion maintaining effect when used without storing for a certain period of time from immediately after producing the adhesive sheet; however after producing the adhesive sheet and storing for certain period of time, then the alcoxy group of the silane compound (D) is lost since it reacts with other alcoxy group or with the inorganic filler which is added in some case, thus it may become difficult to bind with the adherend surface or to have dipole interaction with the adherend surface. Hence, the adhesion at the interface between the adhesive layer and the adherend surface cannot be made strong, and the post heat moist adhesion maintaining effect may be declined.

On the other hand, the silane compound (E) has high post heat moist adhesion maintaining effect when used after storing for certain period of time after the adhesive sheet is produced; however if it is used without storing for certain period of time after the adhesive sheet is produced, it naturally has poor reactivity and is difficult to undergo hydrolysis reaction, hence it may become difficult to bind with the adherend surface or to have dipole interaction with the adherend surface. Hence, the adhesion of the interface between the adhesive layer and the adherend surface cannot be made strong, and the post heat moist adhesion maintaining effect may be declined.

The adhesive composition of the present invention comprises both the silane compound (D) and the silane compound (E), thus these compensates each of the defects of the post heat moist adhesion maintaining effect at before and after the storing period, thereby high post heat moist adhesion maintaining effect at before and after the storing period can be obtained. As a result, the adhesive layer formed from the adhesive composition of the present invention has superior storage stability.

The ratio (d)/(e) of the content (d) of the silane compound (D) and the content (e) of the silane compound (E) only prefers to be within each of above content range, that is usually it is 0.0014 to 700 and preferably 0.05 to 20.

Other Silane Compound (F)

In the present invention, in order to increase the adhesive force of the adhesive composition against the adherend, other silane compound (F) may be used besides silane compound (D), silane compound (D'), silane compound (E), and silane compound (E').

As for the silane compound (F), the compound comprising the group which react with the functional group of the acrylic compound (A) and the epoxy-based heat curable resin (B) or so.

Specifically, γ-aminopropyltrimethoxysilane, N-6-(aminoethyl)-γ-aminopropyltrimethoxysilane, γ-mercaptopropyltrimethoxysilane, methyltrimethoxysilane, methyltriethoxysilane, vinyltrimethoxysilane, imidazolsilane or so may be mentioned. These other silane compound may be used alone or by combining two or more thereof.

Curing Accelerator (G)

The curing accelerator (G) is used to control the curing speed of the adhesive composition. As for the curing accelerator, the compound which can accelerate the reaction between the epoxy group and the phenolic hydroxyl group or amine or so is preferable. As for such compound, specifically, the tertiary amines, imidazoles, organic phosphines, tetraphenylboron salts or so may be mentioned.

As for the tertiary amines, triethylenediamine, benzyldimethylamine, triethanolamine, dimethylaminoethanol, tris(dimethylaminomethyl)phenol or so may be mentioned.

As for the imidazoles, 2-methylimidazole, 2-phenylimidazole, 2-phenyl-4-methylimidazole, 2-phenyl-4-methyl-5-hydroxymethylimidazole, 2-phenyl-4,5-hydroxymethylimidazole or so may be mentioned.

As for the organic phosphines, tributylphosphine, diphenylphosphine, triphenylphosphine or so may be mentioned.

As for the tetraphenylboron salt, tetraphenylphosphoniumtetraphenylborate, triphenylphosphinetetraphenylborate or so may be mentioned.

Note that, the curing accelerator (G) included in the adhesive composition of the present invention may be used alone or by combining two or more thereof.

In the adhesive composition of the present invention, the curing accelerator (G) is comprised 0.001 to 100 parts by weight, more preferably 0.01 to 50 parts by weight, and further preferably 0.1 to 10 parts by weight, with respect to 100 parts by weight of total of the epoxy-based heat curable resin (B) and the heat curing agent (C).

Energy Ray Polymerizing Compound (H)

The adhesive composition of the present invention may comprise the energy ray polymerizing compound (H). By polymerising the energy ray polymerizing compound (H) using the energy ray irradiation, the adhesive force of the adhesive layer of the adhesive sheet can be declined. Therefore, during the pick up step of the semiconductor chip, the release between the base sheet and the adhesive layer can be carried out easily.

The energy ray polymerizing compound (H) is a compound which polymerise and cures by irradiating the energy ray such as the ultraviolet ray and the electron beam or so. As for the energy ray polymerizing compound (H), a compound which have one or more of energy ray polymerizing double bond in the molecule such as acrylate-based compound or so may be mentioned.

As for above acrylate-based compound, trimethylolpropanetriacrylate, pentaerythritoltriacrylate, pentaerythritoltetraacrylate, dipentaerythritolmonohydroxypentaacrylate, dipentaerythritolhexaacrylate, 1,4-butyleneglycoldiacrylate, 1,6-hexanedioldiacrylate, dicyclopentadimethoxydiacrylate, polyethyleneglycoldiacrylate, oligoesteracrylate, urethaneacrylate type oligomer, epoxy modified acrylate, polyetheracrylate, itaconic acid oligomer or so may be mentioned.

The molecular weight of the energy ray polymerizing compound (H) (the weight average molecular weight in case of oligomer or polymer) is usually 100 to 30000, preferably 200 to 9000 or so. In the adhesive composition of the present invention, the content of the energy ray polymer compound (H) is usually 1 to 400 parts by weight, preferably 3 to 300 parts by weight, and further preferably 10 to 200 parts by weight, with respect to 100 parts by weight of the acrylic polymer (A). If the content of the energy ray polymerizing compound (H) exceeds the above range, the adhesive force of the adhesive layer against the organic substrate or the lead flame or so may decline.

Photopolymerization Initiator (I)

When using the adhesive composition of the present invention, in case of using said energy ray polymerizing compound (H), it is preferable to irradiate the energy ray such as the ultraviolet ray or so to reduce the adhesive force of the adhesive layer. By including the photopolymerization initiator (H) in the adhesive composition, the time of polymerization/curing and the amount of the light irradiation can be reduced.

As for the photopolymerization initiator, benzophenon, acetophenon, benzoin, benzoinmethylether, benzomethylether, benzoinisopropylether, benzoinisobutylether, benzoin bezoic acid, benzoin methyl benzoic acid, benzoindimethylketal, 2,4-diethylthioxanthone, α-hydroxycyclohexylphenylketone, benzyldiphenylsulfide, tetramethylthiurammonosulfide, azobisisobutylnitrile, benzyl, dibenzyl, diacetyl, 1,2-diphenylmethane, 2,4,6-trimethylbenzoildiphenylphosphinoxide, β-chloranthraquinone or so may be mentioned. The photopolymerization initiator (I) may be used alone or by combining two or more.

The content of the photopolymerization initiator (I) is usually 0.1 to 10 parts by weight, preferably 1 to 5 parts by weight, with respect to 100 parts by weight of the energy ray polymerizing compound (H). If the content of the photopolymerization initiator (I) becomes below said range, sufficient pick up property may not be obtained due to the insufficient photopolymerization, and if it exceeds said range, the residue which does not contribute to the photopolymerization is generated and the curing of the adhesive composition may be insufficient.

Inorganic Filler (J)

In the present invention, the inorganic filler (J) can be used. By blending the inorganic filler (J) to the adhesive composition, the thermal expansion coefficient can be controlled. By optimizing the thermal expansion coefficient of the adhesive layer after the curing with respect to the semiconductor chip, the lead flame and the organic substrate, the package reliability can be further improved. Also, the moisture absorption rate after the curing of the adhesive layer can be further reduced.

As for the inorganic filler (J), powders such as silica, alumina, talc, calcium carbonate, titanium white, red oxide, silicon carbide, and boron nitride or so, the beads which is the spherical form, the single crystal fiber, and the glass fiber or so thereof may be mentioned. Among these, the silica filler and the alumina filler are preferable. The inorganic filler (J) may be used alone or by combining two or more thereof.

In the present invention, the content of the inorganic filler (J) is usually 1 to 80 wt % with respect to entire adhesive composition (in terms of solid portion). Also the content of the inorganic filler (J) is preferably 1 to 80 wt %, more preferably 2 to 70 parts by weight, further preferably 5 to 60 wt %, and particularly 10 to 50 wt % with respect to 100 parts by weight of total of the component (A) to (E) (in terms of solid portion). If the content of the inorganic filler (J) is within such range, the moisture absorption after the curing of the adhesive layer can be reduced, and the ratio of the inorganic filler in the adhesive layer does not become too large, thus the adhesiveness is less likely to be lost.

Other Component (K)

In the adhesive composition of the present invention, other than the above mentioned components, various additives may be included if necessary. As for various additives, the flexible components such as polyester resin or so, a plasticizer, an antistatic agent, an antioxidant, a pigment, a dye or so may be mentioned.

The adhesive composition of the present invention is superior in the storage stability, has adhesiveness and the heat curable property, and comprises a function to temporary hold various adherends under uncured condition. Particularly, even after storing for certain period of time, at the end the cured product having high impact resistance can be provided via the heat curing, and further the balance between the shear strength and the releasing strength is good, thus a sufficient adhesiveness can be maintained even under a hot and humid harsh condition.

The adhesive composition of the present invention is obtained by mixing the above components in an appropriate ratio. When mixing, each component may be diluted in a solvent in advance, or the solvent may be added when mixing. Also, it may be diluted with the solvent when using the adhesive composition.

As for such solvent, ethyl acetate, methyl acetate, diethyl ether, dimethyl ether, acetone, methylethyl ketone, acetonitrile, hexane, cyclohexane, toluene, heptane or so may be mentioned.

The adhesive composition of the present invention is used as the semiconductor adhesive agent for adhering the semiconductor chip and other object such as the substrate, or the semiconductor chip against each other, by taking the semiconductor chip of silicon, gallium-arsenide or so as the material as the adherend. Especially, it can be suitably used as, so called die bonding sheet, a dicing die bonding sheet, particularly as for the forming material of the adhesive layer constituting the dicing die bonding sheet.

(The Adhesive Sheet)

The adhesive sheet according to the present invention comprises the adhesive layer comprising the above adhesive composition on the base sheet. The form of the adhesive sheet according to the present invention can take various forms such as a tape form, labeling form or so.

As for the base sheet of the adhesive sheet, for example, a transparent film such as polyethylene film, polypropylene film, polybutene film, polybutadiene film, polymethylpentene film, polyvinyl chloride film, vinyl chloride copolymer film, polyethylene telephthalate film, polyethylenenaphthalate film, polybutylenetelephthalate film, polyurethane film, ethylene acetate vinyl copolymer film, ionomer resin film, ethylene/(meth)acrylate copolymer film, ethylene/(meth)acrylate ester copolymer film, polystyrene film, polycarbonate film, poly imide film or so, or a crosslinking film of these transparent film may be mentioned. Also, as the base sheet, it may be a single layer film thereof, or a multilayered film thereof. Also, other than the above transparent film, non-transparent film which is the colored non-transparent film or a fluoride resin film or so can be used.

The adhesive sheet of the present invention is adhered on various adherends, after the predetermined process is performed to the adherend, the adhesive layer is transferred to the adherend, then it is released from the base sheet. That is, the adhesive sheet is used in the process including the step of transferring the adhesive layer to the adherend from the base sheet. Therefore, the surface tension of the side contacting the adhesive layer of the base sheet is preferably 40 mN/m or less, more preferably 37 mN/m or less, and particularly preferably 35 mN/m or less. The base sheet with such relative low surface tension can be obtained by appropriately selecting the material. Also, the base sheet with relatively low surface tension can be obtained by coating the releasing agent to the surface of the base sheet; that is, by performing the releasing treatment.

As for the releasing agent used for the releasing treatment of the base sheet, releasing agents such as alkyd base, silicone base, fluoride base, unsaturated polyester base, polyolefin base, wax base or so may be mentioned, however among these, from the point of view of comprising the heat resistance property, the releasing agents such as the alkyd base, silicone base, fluoride base are preferable.

In order to carry out the releasing treatment to the surface of the base sheet using the above releasing agent, the releasing agent is coated as it is (no solvent included) or under the condition being diluted by the solvent or emulsified condition, using the gravure coater, the Mayer bar coater, the air knife bar coater, roll coater or so. Then the base sheet coated with the releasing agent is cured by setting to the temperature below room temperature or below the heating temperature, or by electron beam or so, the multilayer body may be formed by a wet lamination or dry lamination, a heat melting lamination, a melt extrusion lamination, a coextrusion process or so.

Also, the pressure adhesive agent may be coated on the surface of the base sheet to carry out the tackifying treatment. As for the pressure adhesive agent used for the giving tackiness treatment, the pressure adhesive agent such as the acrylic base, the rubber base, the silicone base, the urethane base or so may be mentioned.

As for the pressure adhesive agent, it is preferable to use the pressure adhesive agent having the removable property, and as for the pressure adhesive agent having a removable property, the pressure adhesive agent having weak adhesion, the pressure adhesive agent having rough surface, the energy ray curable pressure adhesive agent, the heat expanding component containing pressure adhesive agent or so may be mentioned. By using the re-releasable pressure adhesive agent, the base sheet and the adhesive layer are strongly fixed during the processing of the adherend, and then the releasing from the base sheet after transferring the adhesive layer to the adherend becomes easy.

The film thickness of the base sheet is usually 10 to 500 μm or so, preferably 15 to 300 μm or so, particularly 20 to 250 μm or so. Also, the thickness of the adhesive layer is usually 1 to 500 μm or so, preferably 5 to 300 μm or so, and particularly preferably 5 to 150 μm or so.

Note that, before sticking the adhesive sheet to the adherend, in order to protect the adhesive layer of the adhesive sheet, the releasing film for the protection of the surface may be laminated on the surface of the adhesive layer (the side contacting the adherend).

The adhesive sheet may be produced by, for example, coating the compositions constituting the adhesive layer, and then by drying, or it may be produced by transferring said adhesive layer to the base sheet after providing the adhesive layer on the releasing film.

Also, at the outer peripheral of the surface (the side contacting the adherends) of the adhesive layer, additional adhesive layer or pressure adhesive tape may be provided in order to fix other jigs such as the ring flame or so.

(The Production Method of the Semiconductor Device)

In connection with the method of the use of the adhesive sheet according to the present invention, the case which uses said adhesive sheet to the production of the semiconductor device will be taken as an example.

In the production method of the semiconductor device using the adhesive sheet of the present invention, first, the face of one side of the semiconductor wafer and the ring flame is placed on the adhesive layer of the adhesive sheet according to the present invention, and it is lightly pressed to adhere the wafer. Next, by using the cutting means such as the dicing saw or so, on the dicing device, the above semiconductor wafer is cut to obtain the semiconductor chip. Here, the depth of the cut is the cut which has taken into consideration of the total thickness of the semiconductor wafer and the thickness of the adhesive layer, and the abrasion of the dicing saw. Note that, when using the energy ray curable compound (H) to the adhesive composition of the present invention, the ultraviolet ray may be irradiated from the base sheet face of the adhesive sheet at before or after cutting the semiconductor wafer.

Next, depending on the needs, the expansion of the adhesive sheet is carried out to enlarge the gap between the semiconductor chips, thereby it makes the pick up further easier. At this moment, the slip between the adhesive layer and the base sheet is generated, thus the adhesive force between the adhesive layer and the base sheet decreases and the pick up property improves.

By carrying out the pick up of the semiconductor chip as such, the chip can be released from the base sheet while transferring the adhesive layer being cut to the back face of the semiconductor chip. Next, the semiconductor chip is placed on the adherend portion (for example, the die pad portion on the substrate or other semiconductor chip) via the adhesive layer. The adherend portion is heated before the semiconductor chip is placed on, or is heated immediately after placing thereof. Here, the heating temperature at the thermocompression (die bonding) of the chip is usually 80 to 200° C., preferably 100 to 180° C., and the heating time is usually 0.1 second to 5 minutes, and preferably 0.5 seconds to 3 minutes, and the pressure at the thermocompression is usually 1 kPa to 1 GPa. The pressure may be applied after placing on; however it is preferable to apply the pressure at the same time of placing.

After placing the semiconductor chip on to the adherend, the heating may be carried out if needed. The heating condition at this time is within the temperature range of the above, and the heating time is usually 1 to 180 minutes, preferably 10 to 180 minutes.

Also, the heating treatment after being placed on may not be carried out to make the temporary adhered status, and the adhesive layer may be cured using the heating for the resin sealing which is usually carried out during the package production. At that time, usually the pressure of 1.0 to 20 MPa is applied at 150 to 180° C. for 0.5 to 10 minutes or so. Also, in order to sufficiently cure the sealing resin, after the sealing step, usually the heating at 150 to 180° C. for 2 to 8 hours or so is carried out under normal pressure. In addition to the above heat treatment, the heat treatment after the sealing step may be used.

By going through such step, the adhesive layer is cured, and the semiconductor chip and the adherend portion can be adhered strongly. The adhesive layer is fluidized under the die bonding condition, thus it is sufficiently embedded into the ridges and grooves of the adherend portion, and prevents the generation of the void.

That is, in the obtained product, the adhesive agent is cured which is the fixing means of the semiconductor chip, and since it is a structured which is sufficiently embedded in the ridges and grooves of the adherend composition, thus even under a harsh condition, reliable package reliability is attained.

Note that, in the production method of the semiconductor chip device including the step of thermocompression bonding of the semiconductor chip on to other semiconductor chip via the adhesive layer; the step of thermocompression bonding the semiconductor chip via the adhesive layer on to other semiconductor chip which is placed on the organic substrate or lead flame of the die pad portion; or the step of thermocompression bonding the semiconductor chip via the adhesive layer on to other semiconductor chip which is not placed on the organic substrate or lead flame of the die pad portion are included.

The adhesive composition and the adhesive sheet of the present invention can be used for adhering the semiconductor compound, glass, ceramics, and metals other than the above mentioned method of use.

EXAMPLES

Hereinafter, the present invention will be explained based on the examples; however the present invention is not to be limited thereto. Note that, in regards with the adhesive sheet obtained by the examples and the comparative examples, the following evaluations were carried out by using the adhesive sheet performed with the acceleration treatment (left at 40° C. for 7 days), and the adhesive sheet stored in an environment without the acceleration treatment at 23° C. and relative humidity of 50%.
(1) The Shear Strength Measurement
(1-1) The Formation of the Upper Chip The adhesive sheet obtained by the examples and the comparative examples were pasted on to the dry polish treated surface of the silicon wafer (200 mm diameter, 500 µm thickness) of which the dry polish treatment is carried out to the surface using the wafer back side grind device (made by DISCO Corporation, DGP8760), by using the tape mounter (made by Lintec Corporation, Adwill (Registered Trademark), RAD 2500 m/8); thereby it was fixed to the ring flame simultaneously. Then, by using the ultraviolet irradiating device (made by Lintec Corporation, Adwill (Registered Trademark) RAD2000), the ultraviolet ray was irradiated (350 mW/cm$^2$, 190 mJ/cm$^2$) from the base sheet side of said sheet.

Next, by using the dicing device (made by DISCO Corporation, DFD651), the chip having a size of 5 mm×5 mm was diced, the chip was picked up from the base sheet together with the adhesive layer of the adhesive sheet and obtained the upper chip. The depth of the cut during the dicing, 20 µm was cut against the base sheet of the adhesive sheet.
(1-2) The Formation of the Test Piece for the Measurement The dicing tape (made by Lintec Corporation, Adwill D-650) was pasted on to the silicon wafer (200 mm diameter, 725 µm thickness) coated with polyimide-based resin (made by HD Microsystems, PLH708), by using the tape mounter as same as the above. Next, by using the dicing device as same as the above, the silicon wafer was diced into a chip having a size of 12 mm×12 mm, and the chip was picked up. The upper chip obtained in the above (1-1) step was bonded to the face coated with the polyimide-based resin of the chip (the polyimide face), via the adhesive layer under the condition of 100° C. and 300 gf/chip for 1 second. Then, the adhesive layer was cured by heating for 60 minutes under 125° C. and 120 minutes under 175° C., thereby the test piece was obtained.

The obtained test piece was left for 48 hours under the environment of 85° C. 85% RH and the moisture was absorbed, and IR reflow (Reflow furnace: made by Sagami Rikou Co., Ltd. WL-15-20DNX type) of maximum temperature 260° C., heating time of 1 minute was carried out for 3 times against the test piece after the moisture absorption, then the pressure cooker test (condition: 121° C., 2.2 atm, 100% RH) was carried out for 168 hours thereby the test piece being heat moist treated (the test piece for the measurement) was obtained.
(1-3) The Measurement of the Shear Strength The measurement stage of a bond tester (made by Dage Japan Co., Ltd. Bond tester, Series 4000) was set to 25° C., and the test piece for the measurement was left on the measurement stage for 30 seconds. The stress was applied in the horizontal direction (the sheared direction) to the bonding interface (the adhesive layer interface) at the speed of 500 µm/s at the position of the height of 100 µm from the adhesive layer interface; then the force (the shear strength) (N) of destroying the adhering condition at the polyimide face of the test piece was measured. Note that, each shear strengths were measured in regards with the 6 test pieces for the measurement, and the average value thereof was set as the shear strength (N).
(2) The Evaluation of the Surface Mounting Property
(2-1) The Formation of the Upper Chip The adhesive sheets obtained by the examples and the comparative examples were pasted, by using the tape mounter (made by Lintec Corporation, Adwill (Registered Trademark) RAD2500 m/8), on to the dry polish treated face of the silicon wafer (200 mm diameter, 75 µm thickness) having the surface being dry polished by the wafer back side grind device (made by DISCO Corporation, DGP 8760) and it was fixed to the ring flame simultaneously. Then, by using the ultra violet irradiating device (made by Lintec Corporation, Adwill (registered Trade mark) RAD2000), the ultra violet ray was irradiated (350 mW/cm$^2$, 190 mJ/cm$^2$) from the base sheet face of said sheet.

Next, by using the dicing device (made by DISCO Corporation, DFD651), the chip having a size of 8 mm×8 mm was diced, and the chip was picked up from the base sheet together with the adhesive layer of the adhesive sheet, thereby the upper chip was obtained. As for the depth of the cut during the dicing, 20 μm was cut against the base sheet of the adhesive sheet.

(2-2) The Formation of the Lower Chip

As same as the upper chip formation, the die bonding sheet (made by Lintec Corporation, Adwill (registered Trade mark) LE4738) were pasted, by using the tape mounter (made by Lintec Corporation, Adwill (Registered Trade mark) RAD2500 m/8), on to the dry polish treated face of the silicon wafer (200 mm diameter, 75 μm thickness) having the surface being dry polished by the wafer back side grind device (made by DISCO Corporation, DGP8760) and it was fixed to the ring flame simultaneously. Then, by using the ultra violet irradiating device (made by Lintec Corporation, Adwill (registered Trade mark) RAD2000), the ultra violet ray was irradiated (350 mW/cm$^2$, 190 mJ/cm$^2$) from the base sheet face of said sheet.

Next, by using the dicing device (made by DISCO Corporation, DFD651), the chip having a size of 8 mm×8 mm was diced, and the chip was picked up from the base sheet together with the adhesive layer of the dicing die bonding sheet, thereby the lower chip was obtained. As for the depth of the cut during the dicing, 20 μm was cut against the base sheet of the dicing die bonding sheet.

(2-3) The Production of the Semiconductor Package

As a circuit board for die bonding the chip, 2 layer double sided board (LINTEG0001, size: 157 mm×70 mm×0.22 t, maximum gap 15 μm, made by CMK Corporation) with the copper foil multilayer board on the copper foil of which the circuit pattern is formed (made by MITSUBISHI GAS CHEMICAL COMPANY INC, BT resin CCL-HL832HS), and comprising the solder resist (made by TAIYO INK MFG CO., Ltd., PSR-4000AU303) on said pattern was used. Note that, the substrate was left for 20 hours under the atmosphere of 125° C. in order for removing the water and dried.

The lower chip obtained in above (2-2) was picked up together with the adhesive layer, then was placed on the above circuit board via the adhesive layer, and at the same time, was die bonded in the condition of 125° C., 250 gf, for 0.5 second. Next, it was heated in the condition of 120° C. for 30 minutes and further 140° C. for 30 minutes, thereby the adhesive layer was sufficiently heat cured.

Next, the upper chip obtained in above (2-1) was picked up together with the adhesive layer, and was die bonded, in the condition of 125° C., 250 gf, for 0.5 second, on the lower chip which was already adhere cured. Then, under the condition of 125° C. for 1 hour, the adhesive layer of the upper chip was heat cured.

By using the sealing device (made by APIC YAMADA Corporation, MPC-06M Trial press), the circuit board was sealed and transfer molded in the condition of 180° C., resin introduction pressure 6.9 MPa, for 120 seconds, so that the sealed thickness becomes 400 μm by the mold resin (made by KYOCERA Chemical Corporation, KE-G1250). Then, the mold resin was sufficiently cured under normal pressure, 175° C. for 5 hours.

Next, the sealed circuit board was pasted on the dicing tape (made by Lintec Corporation, Adwill (registered Trade mark) D-510T), then by dicing into the size of 15.25 mm×15.25 mm using the dicing device (made by DISCO Corporation, DFD651), the semiconductor package for the evaluation of the surface mounting property was obtained.

(2-4) The Evaluation of the Surface Mounting Property of the Semiconductor Package The obtained semiconductor package was left for 168 hours under the condition of 85° C. 85% RH for moisture absorption, then IR reflow (Reflow furnace: made by Sagami Rikou Co., Ltd. WL-15-20DNX type) of maximum temperature 260° C., heating time of 1 minute was carried out for 3 times. The presence of the floating part/peeled part of the connecting part between the upper chip and the lower chip, the presence of the package crack formation, were evaluated by cross section observation and by scanning ultrasonic reflectscope (made by Hitachi Construction Machinary Co., Ltd., Hye-Focus). Note that, when the peeling area of 5.0 mm$^2$ or more is observed in the connecting portion between the upper chip and the lower chip, it is considered as being peeled off, then 25 packages were introduced into the tests, and the number of the package which did not generate the floating part/peeled part and the package cracks were counted.

[The Component of the Adhesive Composition]

Each component constituting the adhesive composition is as shown in the following and in Table 1. In accordance with the component and the blending amount shown in Table 1, each component was blended and the adhesive composition was prepared.

(A) Acrylic polymer: made by The Nippon Synthetic Chemical Industry Co., Ltd. Coponyl N-4617 (Mw: 370,000)

(B) Epoxy-based heat curable resin:

(B1) liquid epoxy resin: 20 wt % acrylic particle containing bisphenol A type epoxy resin (made by NIPPON SHOKUBAI CO., LTD., acryset BPA328, epoxy equivalent 235 g/eq)

(B2) solid epoxy resin: cresolnovolak type epoxy resin (made by NIPPON KAYAKU Co., Ltd., EOCN-1045, epoxy equivalent 213 to 223 g/eq, softening temperature 90 to 94° C.)

(B3) solid epoxy resin: multifunctional type epoxy resin (made by NIPPON KAYAKU Co., Ltd., EPPN-502H, epoxy equivalent 158 to 178 g/eq, softening temperature 60 to 72° C.)

(B4) solid epoxy resin: DCPD type epoxy resin (made by DIC Corporation, EPICLON HP-7200HH, epoxy equivalent 265 to 300 g/eq, softening temperature 75 to 90° C.)

(C) heat curing agent: novolak type phenol resin (made by ASAHI ORGANIC CHEMICAL INDUSTRY CO., LTD., PAPS-PN4, phenolic hydroxyl group equivalent 104 g/eq, softening temperature 111° C.)

(D) silane compound comprising the organic functional group, and molecular weight of 300 or larger and the alcoxy equivalent of larger than 13 mmol/g:

(D1) copolymer of poly3-(2,3-epoxypropoxy) propylmethoxysiloxane and polydimethoxy siloxane (methoxy equivalent 13.7 to 13.8 mmol/g, molecular weight 2000 to 3000) (made by Mitsubishi Chemical Corporation, MKC silicate MSEP2 (comprising 82 wt % of mixture between D'))

(D2) oligomer type silane coupling agent (made by Shin-etsu Chemical Co., Ltd., X-41-1056, methoxy equivalent 17.1 mmol/g, molecular weight 500 to 1500)

(D') silane compound other than the silane compound (D) having a molecular weight of 300 or more and alcoxy equivalent of larger than 13 mmol/g: polymethoxysiloxane (methoxy equivalent 20.8 mmol/g, molecular weight 600) (made by Mitsubishi Chemical Corporation MKC silicate MSEP2 (comprising 18 wt % of mixture between D1).

(E) Silane compound comprising organic functional group, and molecular weight of 300 or less and the alcoxy equivalent of 13 mmol/g or less:

(E1) γ-glycidoxypropyltrimethoxysilane (made by Shin-etsu Chemical Co., Ltd., KBM-403 methoxy equivalent t 12.7 mmol/g, molecular weight 236.3)

(E2) γ-glycidoxypropyltriethoxysilane (made by Shin-etsu Chemical Co., Ltd., KBE-403 methoxy equivalent 8.1 mmol/g, molecular weight 278.4)

(E3) γ-glycidoxypropylmethyldiethoxysilane (made by Shin-etsu Chemical Co., Ltd., KBE-402 methoxy equivalent 10.8 mmol/g, molecular weight 248.4)

shown in Table 1 was diluted so that the solid portion concentration becomes 50 wt % in terms of methylethylketone; then it was pasted/dried (drying condition: 100° C. for 2 minutes in the oven) so that the thickness after the drying becomes 60 μm on the releasing film (made by Lintec Corporation, SP-PET381031) being silicone treated, thereby the adhesive layer formed on the releasing film was obtained. Then, the adhesive sheet and polyethylene film (thickness of 100 μm, surface tension of 33 mN/m) which is the base sheet were adhered against each other to transfer the adhesive layer onto the base sheet; thereby the desired adhesive sheet was obtained. Each evaluation result is shown in Table 2.

TABLE 1

| Component | | Example | | | Comparative Example | | | | |
|---|---|---|---|---|---|---|---|---|---|
| | | 1 | 2 | 3 | 1 | 2 | 3 | 4 | 5 |
| Acrylic polymer | A | 100 | 100 | 100 | 100 | 100 | 100 | 100 | 100 |
| Epoxy-based heat curable resin | B1 | 58.01 | 58.01 | 58.01 | 58.01 | 58.01 | 58.01 | 58.01 | 58.01 |
| | B2 | 38.67 | 38.67 | 38.67 | 38.67 | 38.67 | 38.67 | 38.67 | 38.67 |
| | B3 | 48.34 | 48.34 | 48.34 | 48.34 | 48.34 | 48.34 | 48.34 | 48.34 |
| | B4 | 19.33 | 19.33 | 19.33 | 19.33 | 19.33 | 19.33 | 19.33 | 19.33 |
| Heat Curing agent | C | 70.24 | 70.24 | 70.24 | 70.24 | 70.24 | 70.24 | 70.24 | 70.24 |
| Silane compound having molecular weight of 300 or larger and alcoxy equivalent larger than 13 mmol/g | D1 | 1.33 | | | 2.66 | | | | |
| | D2 | | 2.43 | 1.62 | | | | | |
| Silane compound other than D1 and D2 having molecular weight of 300 or larger and alcoxy equivalent of larger than 13 mmol/g | D' | 0.29 | | | 0.58 | | | | |
| Silane compound having molecular weight of 300 or less and alcoxy equivalent of 13 mmol/g or less | E1 | 1.73 | 1.73 | 1.15 | | 3.46 | | | 1.73 |
| | E2 | | | 1.35 | | | 4.05 | | 2.03 |
| | E3 | | | | | | | 5.44 | |
| Curing accelerator | G | 0.26 | 0.26 | 0.26 | 0.26 | 0.26 | 0.26 | 0.26 | 0.26 |
| Energy ray polymerizable compound | H | 22.3 | 22.3 | 22.3 | 22.3 | 22.3 | 22.3 | 22.3 | 22.3 |
| Photopolymerizing initiator | I | 0.67 | 0.67 | 0.67 | 0.67 | 0.67 | 0.67 | 0.67 | 0.67 |
| Inorganic filler | J | 127.03 | 127.03 | 127.03 | 127.03 | 127.03 | 127.03 | 127.03 | 127.03 |
| thermoplastic polyester resin | K | 40.54 | 40.54 | 40.54 | 40.54 | 40.54 | 40.54 | 40.54 | 40.54 |

(G) curing accelerator: 2-phenyl-4,5-di(hydroxymethyl) imidazol (made by SHIKOKU CHEMICALS CORPORATION, CUREZOL2PHZ)

(H) energy ray polymerizing compound: dicyclopentadienedimethoxydiacrylate (made by NIPPON KAYAKU Co., Ltd., KAYARAD R-684)

(I) photopolymerization initiator: α-hydroxycyclohexylphenylketone (made by Ciba Speciality Chemicals, IRGACURE 184)

(J) inorganic filler: Si filler (made by Tokuyama Corporation, UF-310)

(K) other components: thermoplastic polyester resin (made by TOYOBO Co., Ltd., Vylon220)

Examples and Comparative Examples

The adhesive composition having the composition shown in Table 1 was used. Within the Table 1, the value of each component indicates the parts by weight in terms of solid portion, and in the present invention, the solid portion refers to entire component of other than the solvent. Note that, in the example 1 and the comparative example 1, the component D and D' was added into the adhesive composition by adding the MKC silicate MSEP2 made by Mitsubishi Chemical Corporation which is the mixture thereof. The adhesive composition

TABLE 2

| | Shear strength (N/chip) | | Surface mounting property evaluation (Number of good product/Number used for testing) | |
|---|---|---|---|---|
| | Without acceleration treatment | With acceleration treatment | Without acceleration treatment | With acceleration treatment |
| example 1 | 150 | 159 | 25/25 | 25/25 |
| example 2 | 236 | 215 | 25/25 | 25/25 |
| example 3 | 216 | 173 | 25/25 | 25/25 |
| comparative example 1 | 154 | 68 | 25/25 | 17/25 |
| comparative example 2 | 136 | 136 | 12/25 | 13/25 |
| comparative example 3 | 140 | 115 | 12/25 | 23/25 |
| comparative example 4 | 142 | 147 | 20/25 | 22/25 |
| comparative example 5 | 126 | 166 | 9/25 | 25/25 |

According to Table 2, in the examples, the high shear strength (150N/chip or more) is maintained even after the acceleration test, also even when it is exposed to harsh reflow condition, it still has high package reliability. That is, the adhesive sheet of the example has superior adhesiveness and the package reliability even after being stored for a certain period of time, under heat moist harsh condition, and reflow steps.

On the other hand, the adhesive sheet which does not include the silane compound (D) (the comparative examples 2 to 5) has poor shear strength and has lower package reliability at before the acceleration treatment, compared to the examples. That is, the adhesive sheet of the comparative example 2 to 5 has poor adhesiveness and the package reliability when going through the heat moist harsh condition and the reflow steps.

Also, the adhesive sheet which does not include the silane compound (E) (the comparative example 1) has poor shear strength and has lower package reliability at after the acceleration treatment, compared to the examples. That is, the adhesive sheet of the comparative example 1 has poor adhesiveness and the package reliability when going through the harsh heat moist condition after being stored for certain period of times and the reflow steps.

The invention claimed is:

1. An adhesive composition for a semiconductor comprising:
   an acrylic polymer (A),
   an epoxy-based heat curable resin (B),
   a heat curing agent (C),
   a silane compound (D) having an organic functional group, molecular weight of 300 or more and an alkoxy equivalent of larger than 13 mmol/g,
   a silane compound (E) having an organic functional group, molecular weight of 300 or less and an alkoxy equivalent of 13 mmol/g or less, and
   wherein said organic functional groups of said silane compound (D) and said silane compound (E) are selected from the group consisting of an epoxy group; a (meth) acryloyl group; a vinyl group excluding a vinyl group in the (meth)acryloyl group, and a mercapto group.

2. The adhesive composition for a semiconductor as set forth in claim 1, wherein the organic functional group in said silane compound (D) or said silane compound (E) is epoxy group.

3. An adhesive sheet for a semiconductor comprising a base sheet and an adhesive layer of the adhesive composition for a semiconductor as set forth in claim 2 on the base sheet.

4. An adhesive sheet for a semiconductor comprising a base sheet and an adhesive layer of the adhesive composition for a semiconductor as set forth in claim 1 on the base sheet.

5. A production method of a semiconductor device comprising steps of:
   adhering the semiconductor wafer to an adhesive layer of semiconductor adhesive sheet as set forth in claim 4 and dicing the semiconductor wafer to form a semiconductor chip,
   picking up the semiconductor chip from the base sheet with transferring the adhesive layer to the back side of the chip, and
   thermocompression bonding the semiconductor chip to an adherend via said adhesive layer.

* * * * *